(12) United States Patent
Broekaert

(10) Patent No.: US 10,116,263 B1
(45) Date of Patent: Oct. 30, 2018

(54) METHOD AND DEVICE FOR TIA OVERLOAD CONTROL IN LOW POWER APPLICATIONS

(71) Applicant: INPHI CORPORATION, Santa Clara, CA (US)

(72) Inventor: Tom Peter Edward Broekaert, Santa Clara, CA (US)

(73) Assignee: INPHI CORPORATION, Santa Clara, CA (US)

(*) Notice: Subject to any disclaimer, the term of this patent is extended or adjusted under 35 U.S.C. 154(b) by 0 days.

(21) Appl. No.: 15/597,077

(22) Filed: May 16, 2017

(51) Int. Cl.
*H03F 3/08* (2006.01)
*H03F 1/52* (2006.01)
*H03F 1/02* (2006.01)
*H03F 3/45* (2006.01)
*H04B 10/61* (2013.01)
*H04B 10/69* (2013.01)

(52) U.S. Cl.
CPC .......... *H03F 1/0205* (2013.01); *H03F 3/082* (2013.01); *H03F 3/087* (2013.01); *H03F 3/45179* (2013.01); *H03F 3/45475* (2013.01); *H04B 10/616* (2013.01); *H04B 10/693* (2013.01)

(58) Field of Classification Search
CPC . H03F 3/08; H03F 3/082; H03F 3/087; H03F 1/52; H03F 1/523

USPC .................................................. 330/298, 308
See application file for complete search history.

(56) References Cited

U.S. PATENT DOCUMENTS

| | | | | |
|---|---|---|---|---|
| 5,606,282 A | * | 2/1997 | Yoshida | H03F 3/082 250/214 A |
| 2005/0052246 A1 | * | 3/2005 | Visocchi | H03F 3/08 330/308 |

* cited by examiner

*Primary Examiner* — Steven J Mottola
(74) *Attorney, Agent, or Firm* — Richard T. Ogawa; Ogawa P.C.

(57) ABSTRACT

A transimpedance amplifier (TIA) device and method of operation therefor. The TIA device can include a semiconductor substrate, a TIA with an input and output configured on the semiconductor substrate, and an overload buffer module coupled to the input terminal of the TIA. The overload buffer module can include a variable current source having an input and an output, and a biased buffer diode coupled to the output of the variable current source and to a ground node. The method of operation can include replicating, by the overload buffer module, the current-voltage (I/V) characteristics of the DC input signal at the output of the overload buffer module, wherein the overload buffer module reduces a total harmonic distortion (THD) of a DC output signal from the output of the TIA.

18 Claims, 11 Drawing Sheets

28nm CMOS TIA

45nm CMOS TIA

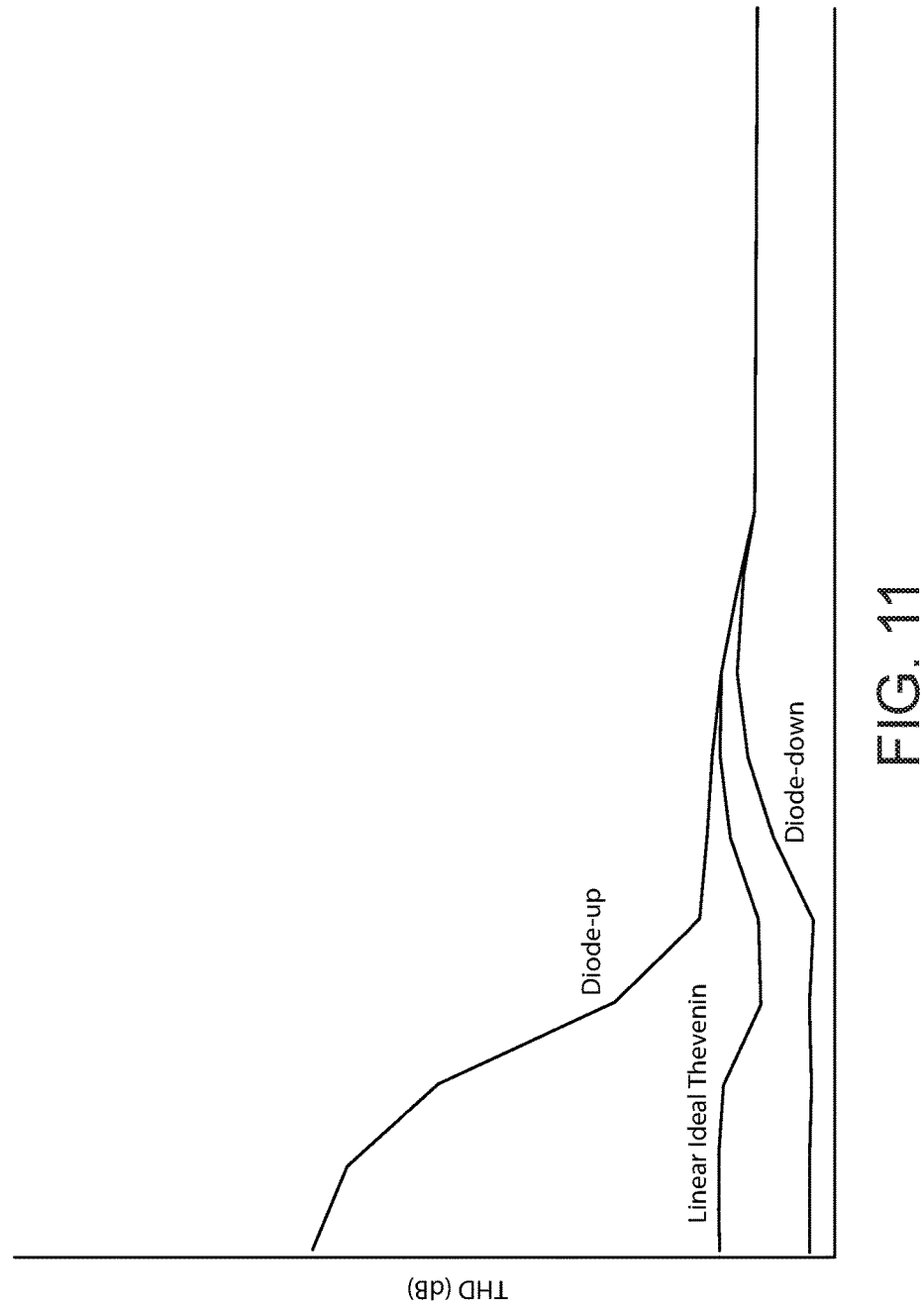

METHOD AND DEVICE FOR TIA OVERLOAD CONTROL IN LOW POWER APPLICATIONS

CROSS-REFERENCES TO RELATED APPLICATIONS

The present invention incorporates by reference, for all purposes, the following commonly owned patent application: U.S. patent application Ser. No. 14/340,388, filed Jul. 24, 2014.

BACKGROUND OF THE INVENTION

The present invention relates to communication systems and integrated circuit (IC) devices. More particularly, the present invention provides for improved methods and devices for overload control of transimpedance amplifiers (TIAs) in low-power applications.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

There have been many types of communication systems and methods. Unfortunately, they have been inadequate for various applications. Therefore, improved communication systems and methods, including improved methods of overload control, are highly desired.

BRIEF SUMMARY OF THE INVENTION

The present invention relates to communication systems and integrated circuit (IC) devices. More particularly, the present invention provides for improved methods and devices for overload control of transimpedance amplifiers (TIAs) in low-power applications.

The present invention provides a transimpedance amplifier (TIA) device and method of operation therefor. The TIA device can include a semiconductor substrate, a TIA with an input and output configured on the semiconductor substrate, and an overload buffer module coupled to the input terminal of the TIA. The overload buffer module can include a variable current source having an input and an output, and a biased buffer diode coupled to the output of the variable current source and to a ground node. The method of operation can include replicating, by the overload buffer module, the current-voltage (I/V) characteristics of the DC input signal at the output of the overload buffer module, wherein the overload buffer module reduces a total harmonic distortion (THD) of a DC output signal from the output of the TIA.

The present invention provides an improved method and circuit device for overload control for a transimpedance amplifier in low-power applications (about 1.8V). In an example, the overload control module of the TIA implements a variable current source electrically coupled to a diode as an AC sink, which provides the overload buffer output at the connection node between the variable current source and the biased diode. This variable current source can be implemented in PFET or PNP technology.

In an embodiment, the present invention provides a transimpedance amplifier (TIA) using an overload control buffer. The overload buffer circuit module includes a variable current source 1011 coupled to a biased diode-down 1012 that is coupled to ground 1099. In an example, the present invention can include a TIA 1030 configured with its input terminal coupled to the overload buffer module 1010. In specific examples, the current source can be (1) configured for control to obtain a DC signal replica, which is good for a coherent detection implementation; or (2) configured in feed-forward (open loop) from gain control.

Many benefits are recognized through various embodiments of the present invention. Such benefits include effective application in low-voltage systems and lower total harmonic distortion (THD) while maintaining low power. The replicating of the input I-V provides the benefit of lower signal distortion. The feed-forward configuration can provide the benefit of eliminating one control loop for lower power and non-match of DC bias, which results in DC current draw in addition to AC current draw. Other benefits will be recognized by those of ordinary skill in the art that the mechanisms described can be applied to other communications systems as well.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which:

FIG. 11 is a simplified graph comparing THD curves of TIAs implemented with diode-down, linear, and diode-up load configurations as an AC sink.

DETAILED DESCRIPTION OF THE INVENTION

Figure 1A:
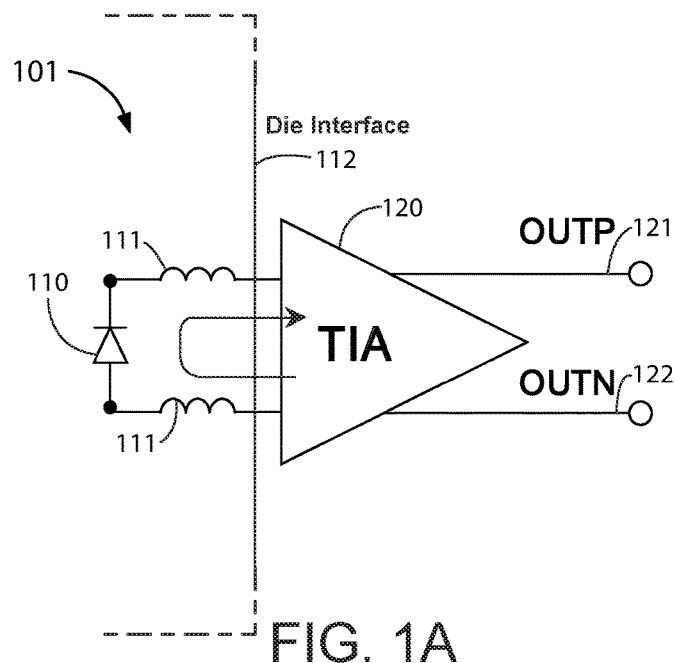
FIG. 1A is a simplified block diagram of a transimpedance amplifier device (TIA) according to an embodiment of the present invention.

The present invention relates to communication systems and integrated circuit (IC) devices. More particularly, the present invention provides for improved methods and devices for overload control of transimpedance amplifiers (TIAs) in low-power applications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In conventional embodiments, the overload control circuit may use an overload buffer implemented as an emitter follower. This implementation suffers from having no headroom in low voltage TIA applications that operate around 1.8V. The present invention provides an improved method and circuit device for overload control for a transimpedance amplifier in low-power applications. In an example, the overload control module of the TIA implements a variable current source electrically coupled to a diode as an AC sink, which provides the overload buffer output at the connection node between the variable current source and the biased diode. This variable current source can be implemented in PFET or PNP technology. Further details are provided below of the device and its components are provided below.

Figure 1B:
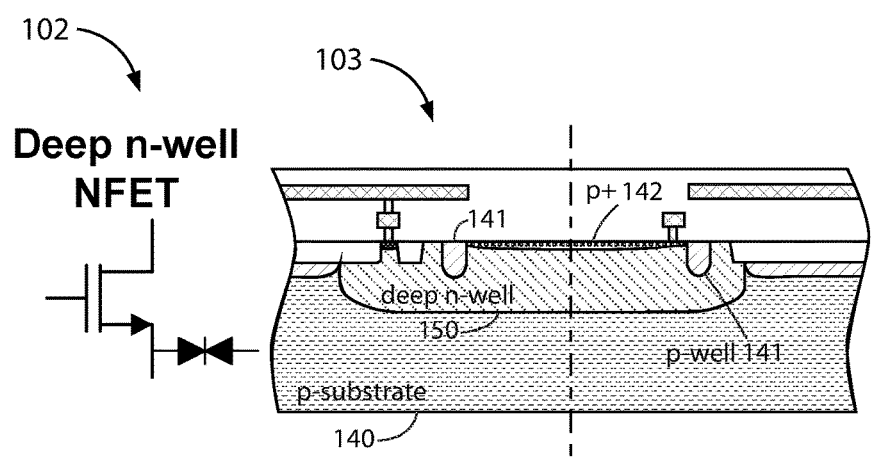
FIG. 1B is a simplified diagram illustrating a deep n-well NFET device according to an embodiment of the present invention.

FIG. 1A is a simplified block diagram of a transimpedance amplifier device (TIA) according to an embodiment of the present invention. As shown, device 101 includes a TIA 120 coupled to a photodiode 110. The photo diode 110 is coupled to inductors 111 that are coupled to the TIA 120 and the photodiode 110 and inductors 111 are shown on the die interface 112. The TIA 120 has a first output terminal OUTP 121 and a second output terminal OUTN 122. In an embodiment, the TIA 120 can be provided in differential self-biased configuration including one or more deep n-well NFET devices, which are shown in FIG. 1B. Differential TIA's can be stacked between multiple supply rails providing a predetermined bias voltage across the photodiode 110.

FIG. 1B is a simplified diagram illustrating a deep n-well NFET device according to an embodiment of the present invention. As shown, NFET 102, represented as a transistor symbol, is shown in a cross-sectional view 103 providing greater detail. The deep n-well NFET is configured on a p-substrate 140 with a deep n-well region 150 overlying the p-substrate 140. A p+ region 142 and one or more p-well regions 141 are configured within one or more portions of the deep n-well region 150.

An advantage of the deep n-well devices 102, which can be provided in a 28 nm process, is that these deep n-well devices can be floated to any positive voltage for various applications, such as telecommunications and the like. The device 101, shown in FIG. 1A, implementing these deep n-well devices can include benefits such as having low inductance radio frequency (RF) return, improved receiver stability, and signal integrity. These benefits can enable higher zT designs of communications IC chip devices with improved RX sensitivity, or receive sensitivity. In a specific embodiment, the differential approach offers a 1.5 dB SNR improvement. Being in a differential configuration also offers common mode rejection (if such a signal is present) and can also enhance linearity as differential architectures allow for even order harmonic suppression. Other benefits will be understood by those of ordinary skill in the art.

Figure 2:
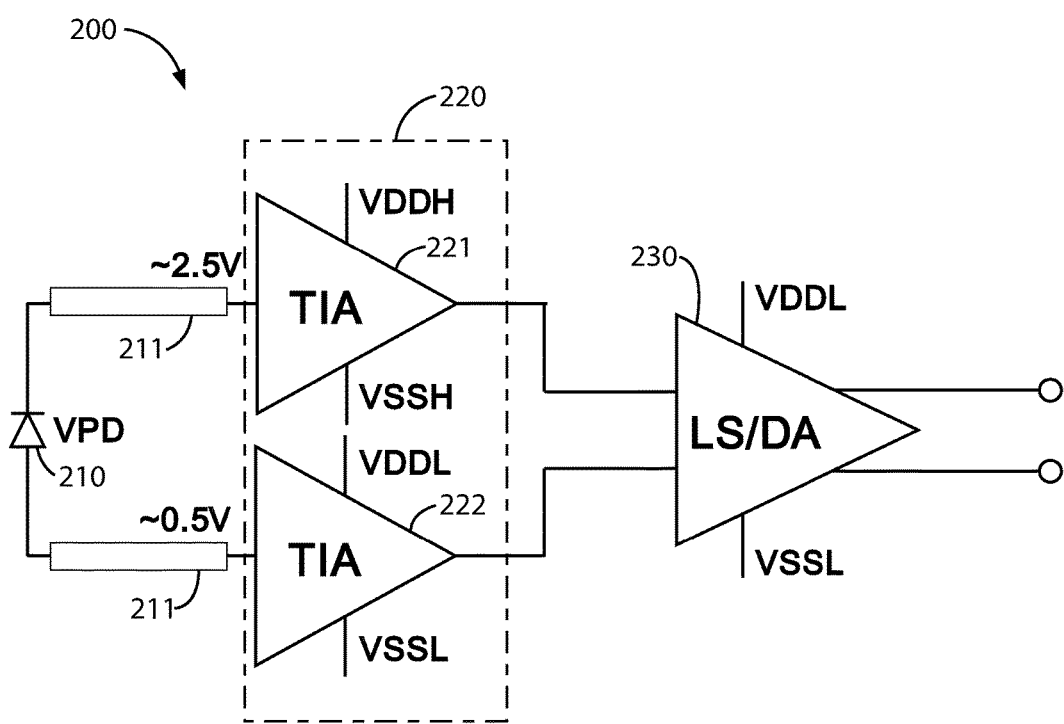
FIG. 2 is a simplified block diagram illustrating a transimpedance amplifier device according to an embodiment of the present invention.

FIG. 2 is a simplified block diagram illustrating a transimpedance amplifier device according to an embodiment of the present invention. As shown, the device 200 includes a photodiode 210 coupled to a differential TIA 220, which is followed by a Level Shifting/Differential Amplifier (LS/DA) 230. The differential TIA 220 includes a first TIA 222 and a second TIA 221. The first TIA 222 can include a first input terminal and a first output terminal. Similarly, the second TIA 221 can include a second input terminal and a second output terminal. The photodiode 210 is coupled between the first input terminal and the second input terminal, shown at nodes 211. The LS/DA 230 can be coupled to the first output terminal and the second output terminal.

In an embodiment, the present invention provides a self-biased differential TIA device. The TIA device includes a semiconductor substrate comprising a plurality of CMOS cells. These CMOS cells can be configured using a 28 nm process technology. Each of the CMOS cells can include a deep n-type well region, as described previously in FIG. 1B.

The first TIA 222 can be configured using a plurality of first CMOS cells, while the second TIA 221 can be configured using a plurality of second CMOS cells such that the second input terminal is operable at any positive voltage level with respect to an applied voltage to a deep n-well for each of the plurality of second CMOS cells.

Using the deep n-well regions, the differential TIA 220 can be self-biased with customizable bias voltages at the TIA inputs. Any positive voltage level can be used (2V, 3V, 5V, etc.) as long as there is 1V across the TIA and there is a differential voltage between the inputs of the first and second TIA of at least 2-5V. The photodiode can be characterized by a responsivity value ranging from about 0.6 to about 0.9 Amps/Watt.

In a specific embodiment, each of the first TIA and the second TIA can be provided with a supply voltage that is independent of a photodiode differential voltage provided on the first input terminal and the second input terminal. As shown in FIG. 2, the first TIA 222 includes a VDDL level and a VSSL level while the second TIA 221 includes a VDDH level and a VSSH level. The LS/DA 230 is also shown with a VDDL level and a VSSL level. Due to the self-biased configuration of the TIAs, these upper and lower supply voltages can be independent of the photodiode bias voltage or the photodiode differential voltage.

In FIG. 2, the VDDH level is about 3V, VSSH is about 2V, VDDL is about 1V, and VSSL is at 0V. The input TIA bias is at about between the VDD/VSS rails, which results in a roughly 2V reverse bias over the photodiode 210. In an embodiment, the high-side TIA (second TIA) current can be recycled to low-side TIA. High-side level shifting can be achieved with AC coupling on the high-side (second TIA) and low-side (first TIA) TIAs to the LS/DA to have reduced or minimum skew. The VPD (photodiode) reverse bias range is about 1 to 2V for VDDH in the 2 to 3V range. AC coupling to the LS/DA enables the wide bias range. In various embodiments, the determined bias ranges and values can depend on the type of application or characteristics of the process technology.

Figure 3:
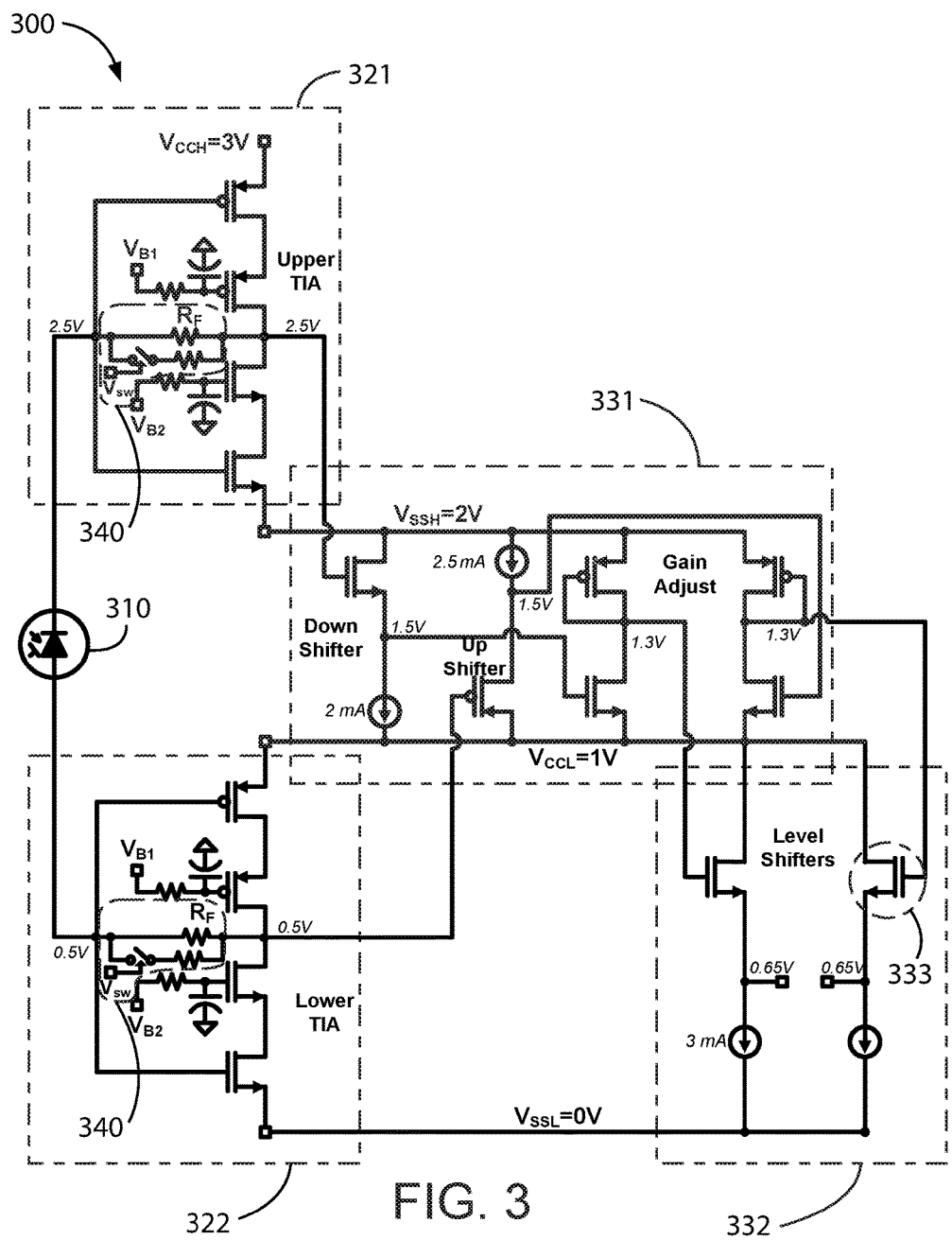
FIG. 3 is a simplified circuit diagram illustrating a fully differential transimpedance amplifier device according to an embodiment of the present invention.

FIG. 3 is a simplified circuit diagram illustrating a fully differential transimpedance amplifier device according to an embodiment of the present invention. As shown, device 300 includes a photodiode 310 coupled to a first TIA 322 and a second TIA 321. The first and second TIAs are coupled to a LS/DA, which includes modules 331 and 332. Module 331 of the LS/DA includes an up-shifting device and a down-shifting device configured to mitigate any mismatch in data bits between the first TIA and the second TIA. The LS/DA can include a differential amplifier having a differential voltage output and can be configured with a level shifter, as shown in module 332. A gain amplifier (gain adjust) can also be provided to correct any losses from either the up-shifting device of the down-shifting device. As an example, transistor 333 is marked to be a deep n-well NFET as shown in FIG. 1B.

This embodiment includes the benefits of being able to float the n-wells at positive voltages allowing for the differential TIAs 321/322 to be stacked between multiple supply rails providing a 2V bias across the photodiode 310. Furthermore, each of the TIAs 321/322 includes a switch mechanism 340 including Vsw, a switch element, and Rf resistors. These switches provide dual-mode operations in two different bit rates (e.g. 10G and 28G, or the like).

In an embodiment, the present invention can provide a transimpedance amplifier (TIA) device. The device can include a semiconductor circuit having a plurality of CMOS cells. Each of these CMOS cells can include a deep n-type well region. In a specific embodiment, the plurality of CMOS cells is configured using a 28 nm process technology.

The device can also include a first TIA being configured using a plurality of first CMOS cells and second TIA being configured using a plurality of second CMOS cells. The first TIA includes a first input terminal and a first output terminal, while the second TIA includes a second input terminal and a second output terminal. The second TIA is configured such that the second input terminal is operable at any positive voltage level with respect to an applied voltage to a deep n-well for each of the plurality of second CMOS cells.

In a specific embodiment, the first TIA includes a VDDL level and a VSSL level, while the second TIA includes a VDDH level and a VSSH level. Each of the TIAs can be provided with a supply voltage independent of a photodiode differential voltage that is provided on the first and second input terminals. Also, each of the first and second TIAs can include a first switch device configured for at least two bit rates.

The device can include a photodiode coupled between the first and second input terminals. In a specific embodiment, the photodiode is characterized by a responsivity value ranging from about 0.6 to about 0.9 Amps/Watt.

Furthermore, the device can include a LS/DA coupled to the first and second output terminals. In a specific embodiment, the LS/DA can include an up-shifting device and a down-shifting device configured to mitigate any mismatch in databits between the first and second TIA. The LS/DA includes differential amplifier having a differential voltage output.

In an embodiment, the device can further include a gain amplifier configured to correct any losses provided by either the up-shifting device or the downshifting device. The LS/DA can also be configured with a level shifter.

In an embodiment, the device can further include an AC source coupled to a first capacitor and configured to the first output terminal. The AC source is also coupled to a second capacitor and configured to the second output terminal.

In an embodiment, the device can further include a clock data recovery module coupled to each of the first and second TIA. This clock data recovery module can be configured with the plurality of CMOS cells. The device can also include a digital signal processor module coupled to each of the first and second TIAs.

While the above is a full description of the specific embodiments, various modifications, alternative constructions and equivalents may be used. Therefore, the above description and illustrations should not be taken as limiting the scope of the present invention which is defined by the appended claims.

Figure 4:
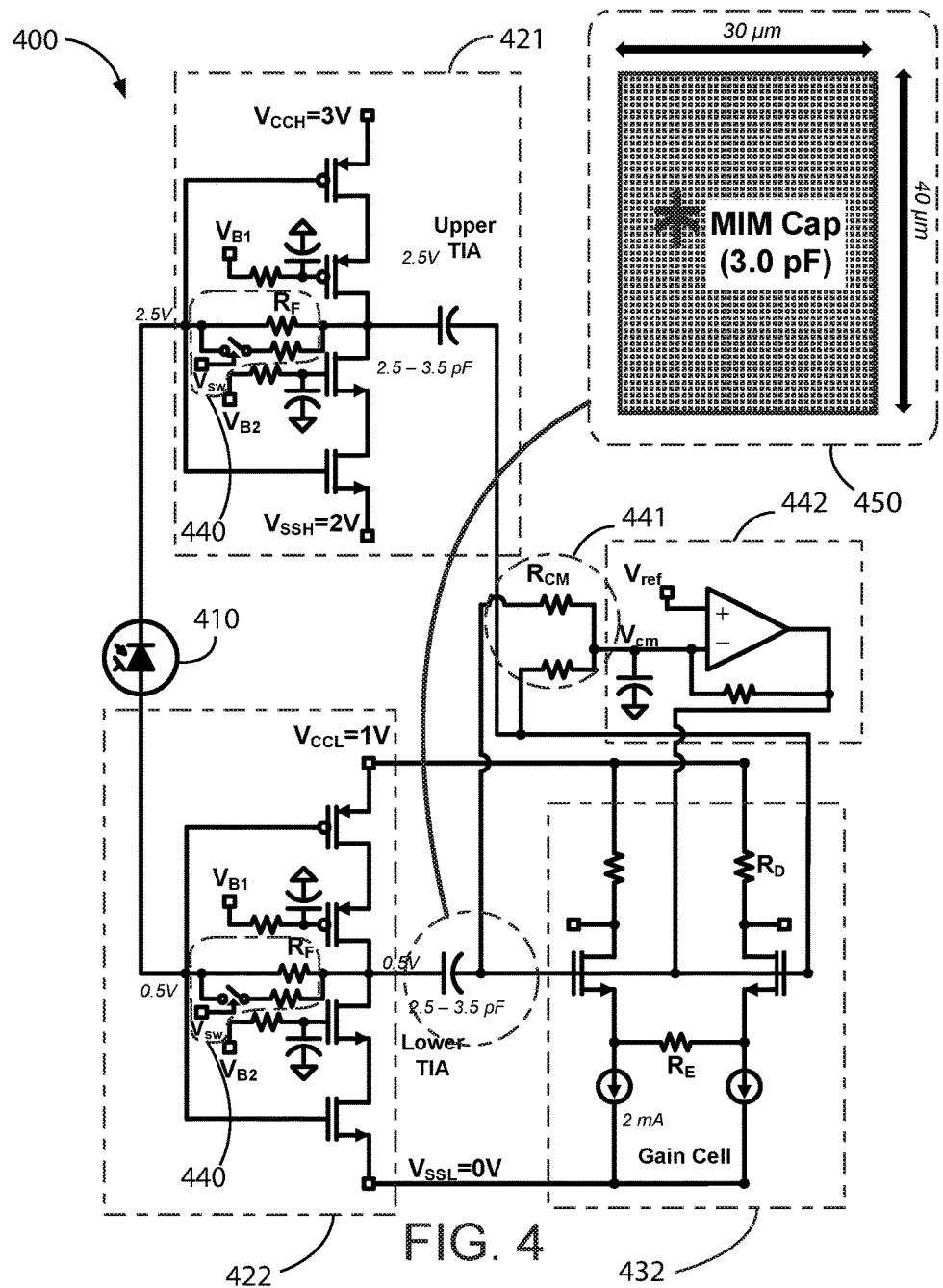
FIG. 4 is a simplified circuit diagram illustrating a fully differential AC-coupled transimpedance amplifier device according to an embodiment of the present invention.

FIG. 4 is a simplified circuit diagram illustrating a fully differential AC-coupled transimpedance amplifier device according to an embodiment of the present invention. As shown, device 400 includes a photodiode 410 coupled to a first TIA 422 and a second TIA 421. The first and second TIAs are coupled to a LS/DA, which includes modules 441, 442, and 432. Each of the TIAs 421/422 includes a switch mechanism 440 including Vsw, a switch element, and Rf resistors. These switches provide dual-mode operations in two different bit rates (e.g. 10G and 28G).

The first and second TIAs 421/422 can be AC-coupled with an AC source coupled to a first capacitor and a second capacitor and being configured to the first TIA output and second TIA output, respectively. In a specific embodiment, the first and second capacitor can include a Metal-Insulator-Metal (MIM) capacitors, as shown in item 450. As an example, the MIM cap can have a 3.0 pF capacitance and have a 30×40 micron dimension. The AC-coupled TIA has the benefit of not suffering from Level shifter loss and is better suited to interface with photodiodes requiring greater than 1V biases. Modules 441 and 442 form an Input Common Mode Feedback (ICMFB) module that is coupled to the first and second capacitors and to a gain cell module 432. Various embodiments may include large coupling capacitors and/or large input common mode feedback resistors.

The present invention also provides a system configured on a single integrated circuit (IC) chip device. The system can include a semiconductor substrate including a plurality of CMOS cells. Each of these CMOS cells includes a deep n-type well region. The system includes a TIA module, which includes a first TIA and a second TIA. The first TIA includes a first input terminal and a first output terminal. The first TIA is configured using a plurality of first CMOS cells. The second TIA includes a second input terminal and a second output terminal. The second TIA configured using a plurality of second CMOS cells such that the second input terminal is operable at any positive voltage level with respect to an applied voltage to a deep n-well for each of the plurality of second CMOS cells.

In an embodiment, the system includes a photodiode coupled between the first input terminal and the second input terminal. The photodiode is configured as a discrete device and separate from the first and second TIAs. The system includes an LS/DA coupled to the first and second output terminals. In a specific embodiment, the first and second input terminals are provided with a differential voltage ranging from about 1V to about 5V. Also, the system includes a Clock and Data Recovery (CDR) module coupled to the TIA module, and configured with a plurality of CMOS cells. Of course, there can be other variations, modifications, and alternatives.

Figure 5:
FIG. 5 is a simplified table describing characteristics of transimpedance amplifier devices according to various embodiments of the present invention.

FIG. 5 is a simplified table describing characteristics of transimpedance amplifier devices according to various embodiments of the present invention. Table 500 lists example results of a simulated comparison between a 28 nm CMOS TIA, 45 nm CMOS TIA, and a 130 nm Bi-CMOS TIA. The 28 nm CMOS TIA, according to an embodiment of the present invention, is shown to have comparable performance to the 130 nm Bi-CMOS TIA. TIA designs using the 28 nm process provided the best gain and noise characteristics with some power drawbacks. By comparison, the 45 nm TIA designs suffered from poor gain and bandwidth due to low intrinsic gain requiring an additional gain stage. Furthermore, in these examples, the CMOS TIA designs have 10G/28G capabilities implemented using switches.

Figures 6A, 6B:
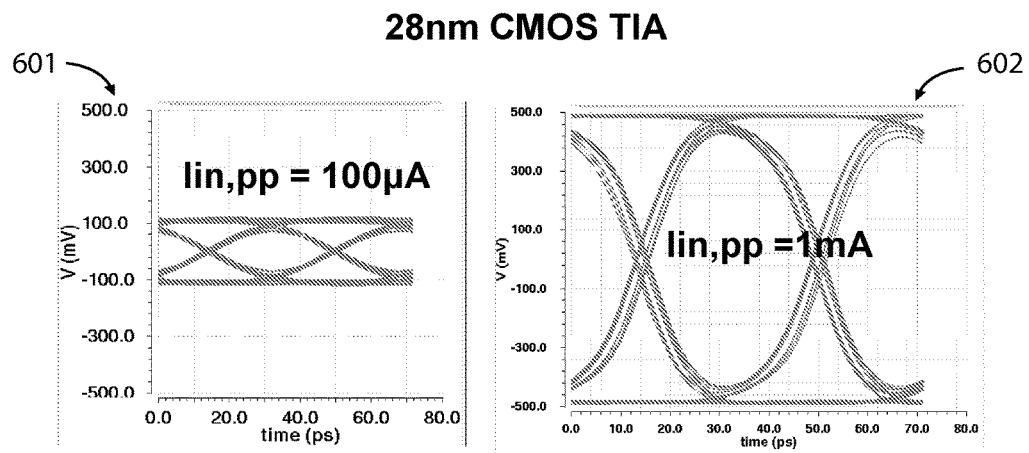
FIGS. 6A and 6B are simplified graphs illustrating a simulation of a 28 nm CMOS TIA according to an embodiment of the present invention.
Figures 6C, 6D:
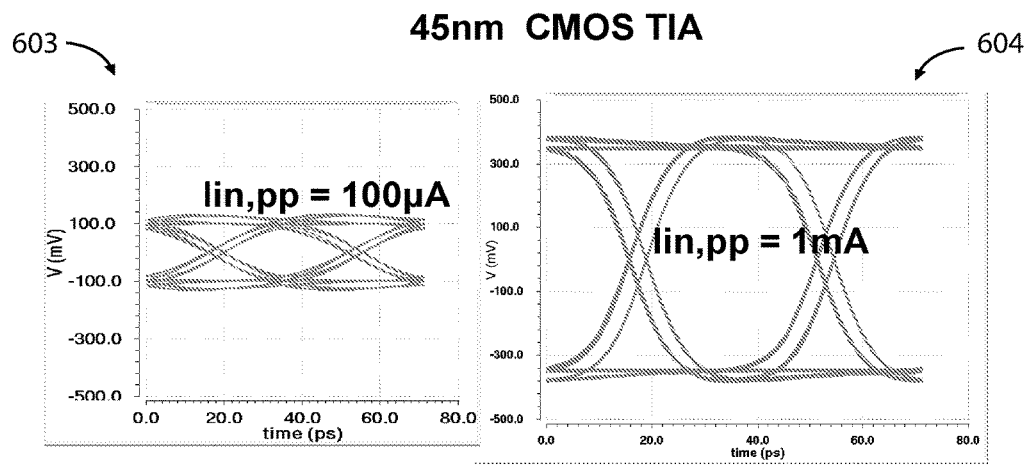
FIGS. 6C and 6D are simplified graphs illustrating simulation of a 45 nm CMOS TIA according to an embodiment of the present invention.

FIGS. 6A and 6B are simplified graphs illustrating a simulation of a 28 nm CMOS TIA according to an embodiment of the present invention. Graph 601 shows a voltage over time simulation with $I_{in,pp}$=100 microAmps and graph 602 shows a voltage over time simulation with $h_{in,pp}$=1 milliAmp. FIGS. 6C and 6D are simplified graphs illustrating simulation of a 45 nm CMOS TIA according to an embodiment of the present invention. Similar to FIGS. 6A and 6B, graph 603 shows a simulation graph with $i_{in,pp}$=100 microAmps, and graph 604 shows a simulation with $i_{in,pp}$=1 milliAmp.

Figure 6E:
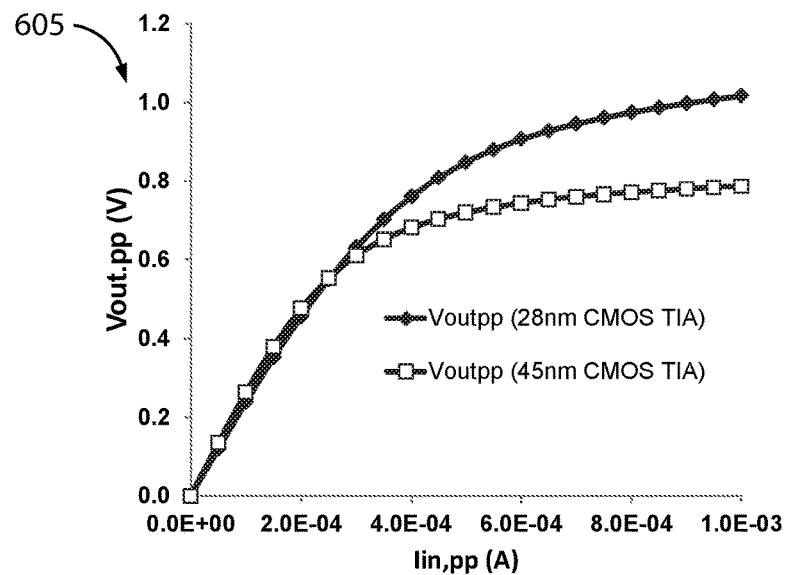
FIG. 6E is a simplified graph illustrating a simulation comparing a 28 nm CMOS TIA and a 45 nm CMOS TIA according to various embodiments of the present invention.

FIG. 6E is a simplified graph illustrating a simulation comparing a 28 nm CMOS TIA and a 45 nm CMOS TIA according to various embodiments of the present invention. This graph 605 shows the simulated differential $V_{out,pp}$ versus $I_{in,pp}$ at 28 Gbps. The higher data deterministic jitter (DDJ) in the 45 nm CMOS TIA is due to poor phase linearity, which is measured with group delay (GD) variation. In order to get higher total bandwidth, the TIA ($1^{st}$ stage) gain is reduced, which results in peaking (less pole splitting) causing higher GD variation (seen at lower swings). The 28 nm CMOS TIA is shown to give better linearity and higher voltage swing compared to the 45 nm CMOS TIA for similar trans-impedance gain (~1.0 kiloOhms) and bandwidth (~17.5 G).

Figure 7:
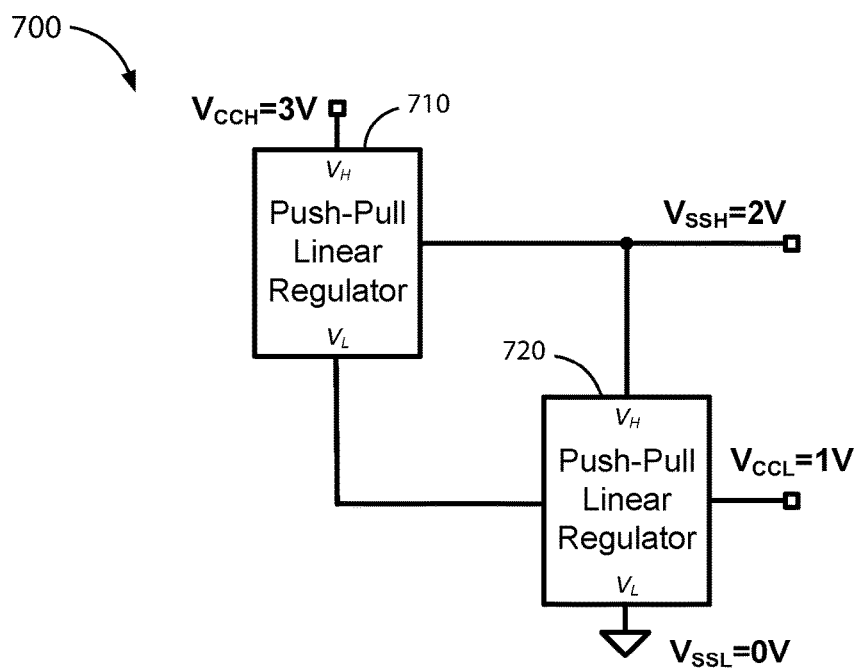
FIG. 7 is a simplified block diagram illustrating a power supply regulator according to an embodiment of the present invention.

FIG. 7 is a simplified block diagram illustrating a power supply regulator according to an embodiment of the present invention. Device 700 is a multi-level power supply regulator module including a pair of push-pull linear regulators 710 and 720. Using a DC-DC down conversion through a charge recycling scheme to support multiple supply domains can save power. For example, the push-pull linear regulators 710, 720 can be stacked to regulate 2V and 1V internal voltages from a 3V reference. By delivering power in a 3V system at 3× the nominal voltage (i.e. 1.0 V), the load current is reduced by 3×. Device 700 can be implemented in various embodiments of the fully differential self-biased TIA devices as described previously.

Figure 8:
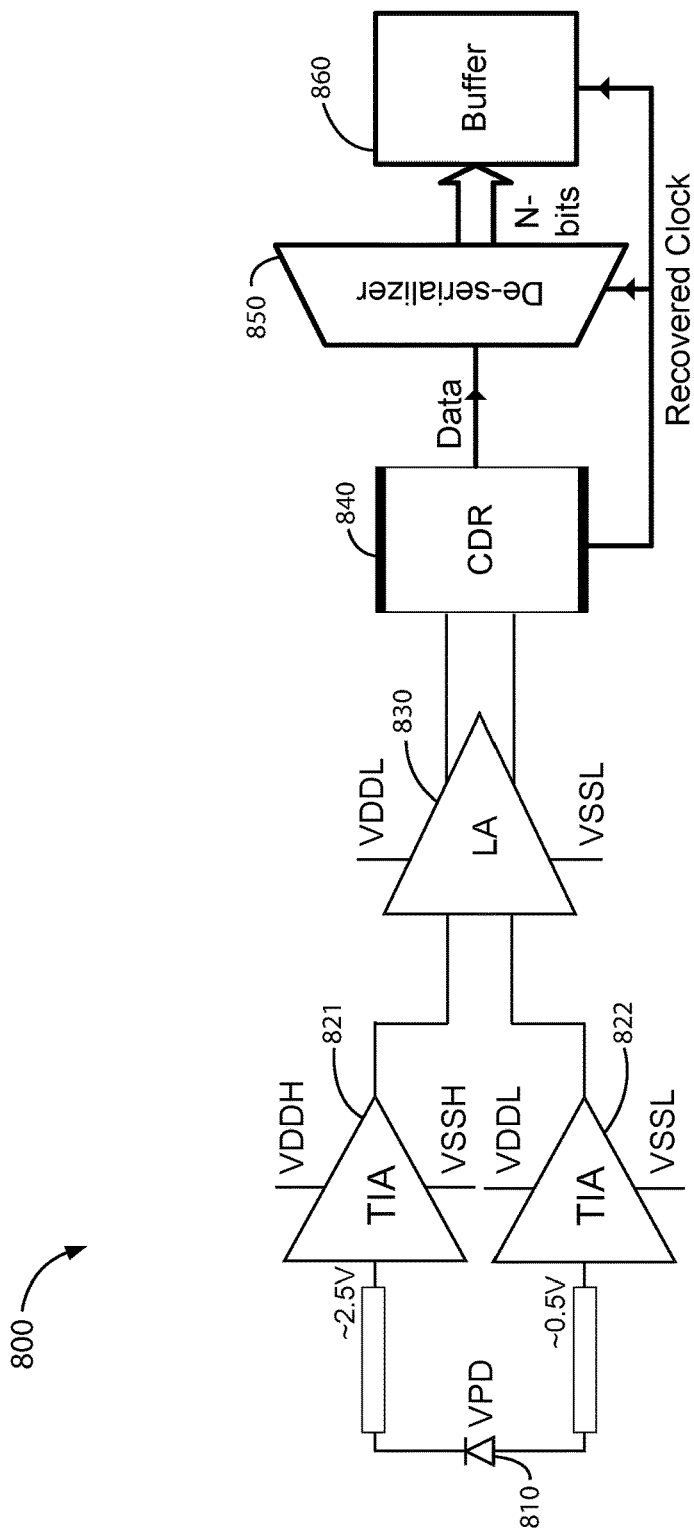
FIG. 8 is a simplified block diagram illustrating a transimpedance amplifier device according to an embodiment of the present invention.

FIG. 8 is a simplified block diagram illustrating a transimpedance amplifier device according to an embodiment of the present invention. As shown, the device 800 includes a photodiode 810 coupled to a differential TIA, which is followed by a Limiting Amplifier (LA) 830. The differential TIA includes a first TIA 822 and a second TIA 821. The first TIA 822 can include a first input terminal and a first output terminal. Similarly, the second TIA 821 can include a second input terminal and a second output terminal. The photodiode 810 is coupled between the first input terminal and the second input terminal. The LA 830 can be coupled to the first output terminal and the second output terminal. The LA 830 is followed by a CDR circuit 840, which sends data to a de-serializer module 850 and to a buffer 860. The CDR circuit 840, de-serializer 850, and the buffer 860 are coupled to a recovered clock. In an embodiment, the de-serializer 850 includes N-bit De-multiplexers from high speed (×1) to lower speed (×1/N) types.

Figure 9:
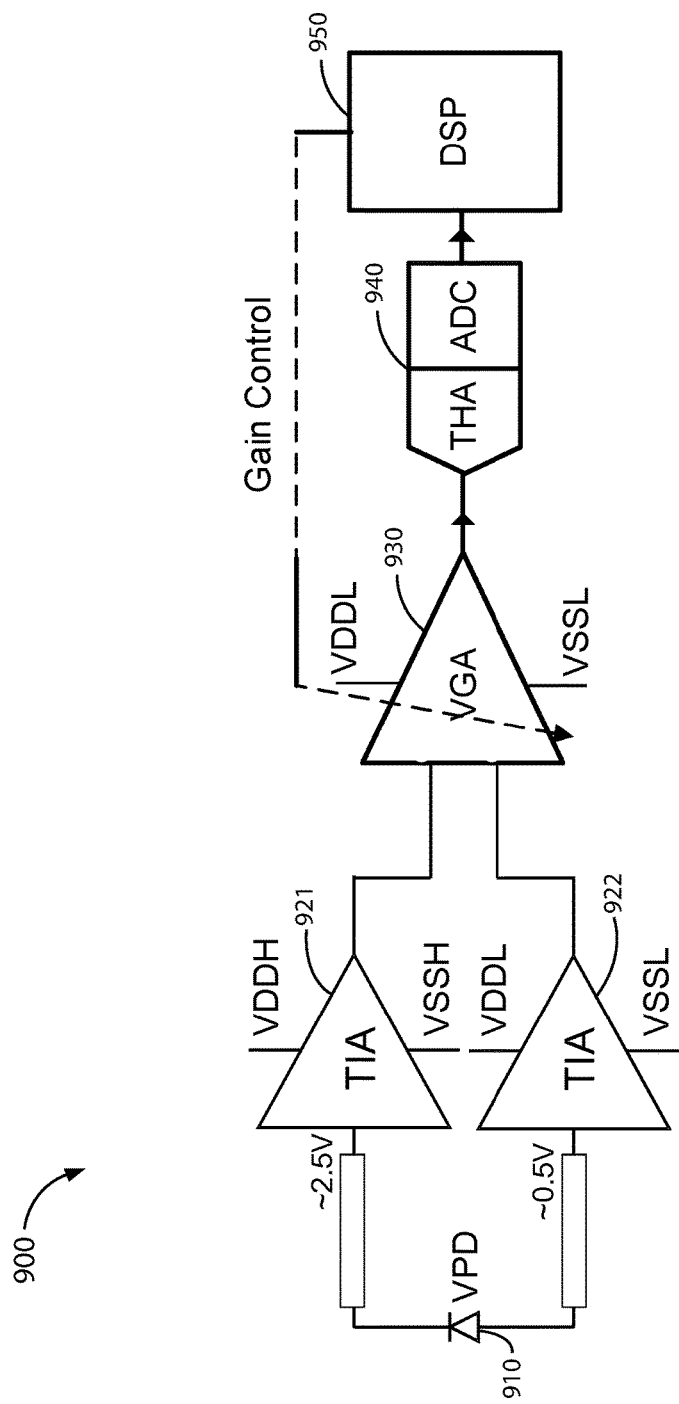
FIG. 9 is a simplified block diagram illustrating a transimpedance amplifier device according to an embodiment of the present invention.

FIG. 9 is a simplified block diagram illustrating a transimpedance amplifier device according to an embodiment of the present invention. As shown, the device 900 includes a photodiode 910 coupled to a differential TIA, which is followed by a Variable Gain Amplifier (VGA) 830. The differential TIA includes a first TIA 922 and a second TIA 921. The first TIA 922 can include a first input terminal and a first output terminal. Similarly, the second TIA 921 can include a second input terminal and a second output terminal. The photodiode 910 is coupled between the first input terminal and the second input terminal. The VGA 930 can be coupled to the first output terminal and the second output terminal. The VGA 930 is followed by a Track and Hold (THA) module coupled to an Analog to Digital Converter (ADC) module. The THA/ADC module is also coupled to a Digital Signal Processor (DSP), which can be configured with the plurality of CMOS cells to perform various functions such as channel estimation and compensation, frequency/phase alignment, and symbol synchronization.

In an embodiment, the present invention provides a system configured on a single IC chip device. The system can be provided on a semiconductor substrate having a plurality of CMOS cells, each of which having a deep n-type well region. The system can include a differential TIA that includes a photodiode coupled to a differential TIA, which is followed by a Level Shifting/Differential Amplifier (LS/DA). The differential TIA includes a first TIA and a second TIA. The first TIA can include a first input terminal and a first output terminal. Similarly, the second TIA can include a second input terminal and a second output terminal. The photodiode is coupled between the first input terminal and the second input terminal, shown at nodes. In a specific embodiment, the photodiode is a discrete device that is separate from the TIA device. The LS/DA can be coupled to the first output terminal and the second output terminal.

In an embodiment, the present invention provides a self-biased differential TIA device. The TIA device includes a semiconductor substrate comprising a plurality of CMOS cells. These CMOS cells can be configured using a 28 nm process technology. Each of the CMOS cells can include a deep n-type well region, as described previously in FIG. 1B. The first TIA can be configured using a plurality of first CMOS cells, while the second TIA can be configured using a plurality of second CMOS cells such that the second input terminal is operable at any positive voltage level with respect to an applied voltage to a deep n-well for each of the plurality of second CMOS cells. In a specific embodiment, the differential voltage provided across the first and second input terminals ranges from about 1 volt to about 5 volts.

Using the deep n-well regions, the differential TIA can be self-biased with customizable bias voltages at the TIA inputs. Any positive voltage level can be used (2V, 3V, 5V, etc.) as long as there is 1V across the TIA and there is a differential voltage between the inputs of the first and second TIA of at least 2-5V. The photodiode can be characterized by a responsivity value ranging from about 0.6 to about 0.9 Amps/Watt.

In a specific embodiment, each of the first TIA and the second TIA can be provided with a supply voltage that is independent of a photodiode differential voltage provided on the first input terminal and the second input terminal. The first TIA includes a VDDL level and a VS SL level while the second TIA includes a VDDH level and a VSSH level. The LS/DA is also shown with a VDDL level and a VSSL level. Due to the self-biased configuration of the TIAs, these upper and lower supply voltages can be independent of the photodiode bias voltage or the photodiode differential voltage. Specific configurations of this system can be similar to the embodiments depicted in FIGS. 3 and 4.

In an embodiment, the present invention provides a self-biased fully differential TIA designed in a 1V deep submicron. As CMOS technology scales, operating supply voltages are self-biased. An automatic clock phase adjustment architecture for synchronization of multiple high-speed is also provided.

Future 1 THz and 400 GHz Optical Fiber Links will have multiple channels with 28G and 10G Optical Receivers (Rx) on a single silicon chip implemented in a high-speed deep-submicron CMOS technology. As CMOS technology is scaled down to make circuits and systems run at higher speed and occupy smaller chip (die) area, the operating supply voltage is reduced for lower power. Conventional FET transistors in deep-submicron CMOS processes have very low breakdown voltage, as a result the operating supply voltage is maintained around 1 Volt. The Photo-detectors (PD) used in 28G and 10G Optical Receivers require a bias voltage of more than 2 Volts across the anode and cathode nodes of the PD for better photo-current responsivity.

Typically, in existing high speed TIA's the PD is AC-coupled to the trans-impedance amplifier (TIA) and/or external voltage is used to bias the PD. AC-coupling between PD and TIA reduces the system sensitivity. Moreover, with multiple channels (over 50 channels in conventional embodiments) the external bias circuits add to the system complexity and increases the module cost. Embodiments of the present invention eliminate the need of external bias circuits and all bias voltages to the PD will be internally generated by the CMOS TIA. Additionally, the architecture described here AC-couples the PD to the TIA reducing noise and improving sensitivity.

The present invention provides an improved method and circuit device for overload control for a transimpedance amplifier in low-power applications (about 1.8V). In an example, the overload control module of the TIA implements a variable current source electrically coupled to a diode as an AC sink, which provides the overload buffer output at the connection node between the variable current source and the biased diode. This variable current source can be implemented in PFET or PNP technology.

In specific examples, the current source can be (1) configured for control to obtain a DC signal replica, which is good for a coherent detection implementation; or (2) configured in feed-forward (open loop) from gain control. The feed-forward configuration can provide the benefits of eliminating one control loop for lower power and non-match of DC bias, which results in DC current draw in addition to AC current draw.

In addition the compatibility with low-voltage operations, using the present overload buffer in a TIA provides a better current-voltage (I-V) match between the I-V of the TIA input and the buffer output, which results in lower total harmonic distortion (THD).

Figure 10:
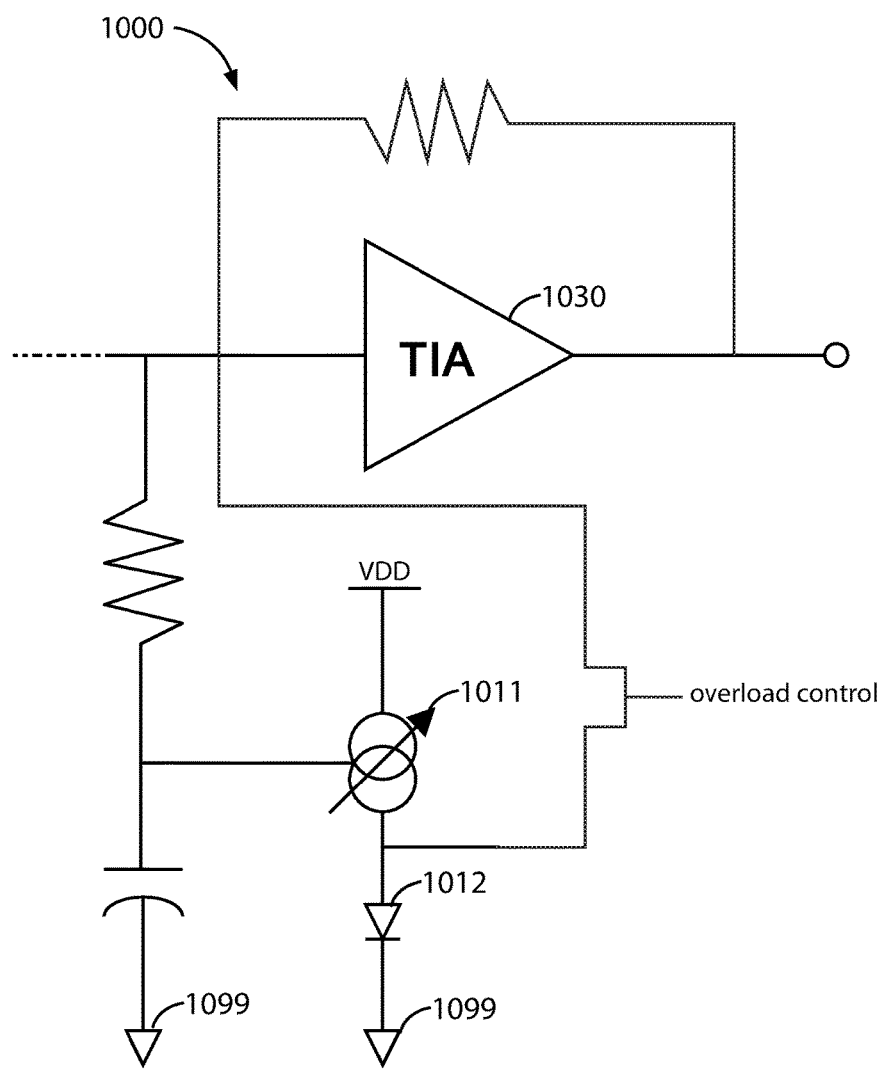
FIG. 10 is a simplified diagram illustrating an overload buffer circuit module 1000 according to an example of the present invention.

FIG. 10 is a simplified diagram illustrating a TIA 1030 implemented an overload buffer circuit module 1010 according to an example of the present invention. As shown, the overload buffer circuit module includes a variable current source 1011 coupled to a biased diode-down 1012 that is coupled to ground 1099. In an example, the present invention can include a TIA 1030 configured with its input terminal coupled to the overload buffer module 1010. In a specific example, the overload buffer circuit module can be configured in an feed forward open loop operation, which can provide the benefit of eliminating one control loop for lower power and non-match of DC bias, which results in DC current draw in addition to AC current draw. In a specific example, the overload buffer circuit module can be configured in a closed loop configuration (as shown), which can replicate the input I-V to provide lower signal distortion. The output voltage of the overload control module can be maintained near zero DC voltage.

FIG. 11 is a simplified graph comparing THD curves of TIAs implemented with diode-down, linear, and diode-up load configurations as an AC sink. As shown, the diode-down configuration exhibits a lower THD curve compared to the linear (linear ideal thevenin) and diode-up configurations. The diode-down configuration emulates large signal behavior of the TIA input base-emitter diode and has a compensating effect for THD. Thus, the better "I-V match" of the diode-down configuration results in lower THD.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A transimpedance amplifier (TIA) device comprising:
   a semiconductor substrate;
   a TIA configured on the semiconductor substrate, the TIA comprising an input terminal and an output terminal; and
   an overload buffer module coupled to the input terminal of the TIA, the overload buffer module comprising:

a variable current source having an input and an output, and a biased buffer diode coupled to the output of the variable current source;

wherein the biased buffer diode is coupled to a ground node; and wherein the variable current source is configured as a control source to replicate a DC signal at the output.

2. The device of claim 1 wherein the variable current source is configured from a P-type MOSFET transistor.

3. A transimpedance amplifier (TIA) device comprising:
a semiconductor substrate;
a TIA configured on the semiconductor substrate, the TIA comprising an input terminal and an output terminal; and
an overload buffer module coupled to the input terminal of the TIA, the overload buffer module comprising:
a variable current source having an input and an output, and
a biased buffer diode coupled to the output of the variable current source;
wherein the biased buffer diode is coupled to a ground node; and
wherein the variable current source is configured as a feed-forward source from gain control.

4. The device of claim 1 wherein the biased buffer diode is configured as a down-biased diode.

5. The device of claim 1 wherein the biased buffer diode is configured as an AC sink.

6. A method for operating a transimpedance amplifier (TIA) device:
providing a transimpedance amplifier (TIA) device comprising:
a semiconductor substrate;
a TIA configured on the semiconductor substrate, the TIA comprising an input terminal and an output terminal; and
an overload buffer module coupled to the input terminal of the TIA, the overload buffer module comprising
a variable current source having an input and an output, and
a biased buffer diode coupled to the output of the variable current source;
wherein the biased buffer diode is coupled to a ground node;
sending a DC input signal to the input of the TIA;
replicating, by the overload buffer module, the current-voltage (I/V) characteristics of the DC input signal at the output of the overload buffer module, wherein the overload buffer module reduces a total harmonic distortion (THD) of a DC output signal from the output of the TIA;
wherein the variable current source is configured as a control source to replicate a DC signal at the output.

7. The method of claim 6 wherein the variable current source is configured from a P-type MOSFET transistor.

8. A method for operating a transimpedance amplifier (TIA) device:
providing a transimpedance amplifier (TIA) device comprising:
a semiconductor substrate;
a TIA configured on the semiconductor substrate, the TIA comprising an input terminal and an output terminal; and
an overload buffer module coupled to the input terminal of the TIA, the overload buffer module comprising
a variable current source having an input and an output, and
a biased buffer diode coupled to the output of the variable current source;
wherein the biased buffer diode is coupled to a ground node;
sending a DC input signal to the input of the TIA;
replicating, by the overload buffer module, the current-voltage (I/V) characteristics of the DC input signal at the output of the overload buffer module, wherein the overload buffer module reduces a total harmonic distortion (THD) of a DC output signal from the output of the TIA; and
wherein the variable current source is configured as a feed-forward source from gain control.

9. The method of claim 6 wherein the biased buffer diode is configured as a down-biased diode.

10. A transimpedance amplifier (TIA) device comprising:
a semiconductor substrate comprising a plurality of CMOS cells, each of the CMOS cells comprising a deep n-type well region;
a first TIA comprising a first input terminal and a first output terminal, the first TIA configured using a plurality of first CMOS cells;
a first overload buffer module coupled to the first input terminal of the first TIA, the first overload buffer module comprising:
a first variable current source having an input and an output, and
a first biased buffer diode coupled to the output of the variable current source;
wherein the first biased buffer diode is coupled to a ground node;
a second TIA comprising a second input terminal and a second output terminal, the second TIA configured using a plurality of second CMOS cells such that the second input terminal is operable at any positive voltage level with respect to an applied voltage to a deep n-well for each of the plurality of second CMOS cells;
a second overload buffer module coupled to the second input terminal of the second TIA, the second overload buffer module comprising:
a second variable current source having an input and an output, and
a second biased buffer diode coupled to the output of the second variable current source;
wherein the second biased buffer diode is coupled to the ground node;
a photodiode coupled between the first input terminal and the second input terminal; and
a Level Shifting/Differential Amplifier (LS/DA) coupled to the first output terminal and the second output terminal.

11. The device of claim 10 wherein the first and second variable current sources are configured from P-type MOSFET transistors; and
wherein the first and second variable current sources are configured as a control sources to replicate a DC signal at each of the outputs for the first and second variable current sources or as a feed-forward sources from gain controls.

12. The device of claim 10 wherein the first and second biased buffer diode are configured as down-biased diodes.

13. The device of claim 10 wherein the first TIA comprises a VDDL level and a VSSL level; and wherein the second TIA comprises a VDDH level and a VSSH level.

14. The device of claim 10 wherein the plurality of CMOS cells is configured using a 28 nm process technology; and
wherein the photodiode is characterized by a responsivity value ranging from about 0.6 to about 0.9 Amps/Watt.

15. The device of claim 10 wherein each of the first TIA and the second TIA is provided with a supply voltage independent of a photodiode differential voltage provided on the first input terminal and the second input terminal; and
wherein each of the first TIA and the second TIA includes a first switch device configured for at least two bit rates.

16. The device of claim 10 wherein the LS/DA comprises an up-shifting device and a down-shifting device configured to mitigate any mismatch in data bits between the first TIA and the second TIA; wherein the LS/DA comprises a differential amplifier having a differential voltage output.

17. The device of claim 10 wherein the LS/DA comprises an up-shifting device and a down-shifting device configured to mitigate any mismatch in data bits between the first TIA and the second TIA; and
further comprising a gain amplifier configured to correct any losses provided by either the up-shifting device or the down-shifting device; wherein the LS/DA comprises a differential amplifier having a differential voltage output.

18. The device of claim 10 further comprising:
an AC source coupled to a first capacitor and configured to the first output terminal, the AC source also coupled to a second capacitor and configured to the second output terminal; and
a level shifter configured with the LS/DA.

* * * * *